United States Patent
Ogawa (10) Patent No.: US 12,540,392 B2
(45) Date of Patent: Feb. 3, 2026

(54) METHOD OF MANUFACTURING SEMICONDUCTOR DEVICE, SUBSTRATE PROCESSING APPARATUS, RECORDING MEDIUM, AND METHOD OF PROCESSING SUBSTRATE

(71) Applicant: Kokusai Electric Corporation, Tokyo (JP)

(72) Inventor: Arito Ogawa, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 17/881,375

(22) Filed: Aug. 4, 2022

(65) Prior Publication Data
US 2023/0037898 A1    Feb. 9, 2023

(30) Foreign Application Priority Data
Aug. 5, 2021    (JP) .................... 2021-128801

(51) Int. Cl.
*C23C 16/455*    (2006.01)
*C23C 16/52*    (2006.01)
(Continued)

(52) U.S. Cl.
CPC ........ *C23C 16/45523* (2013.01); *C23C 16/52* (2013.01); *H01L 21/28568* (2013.01);
(Continued)

(58) Field of Classification Search
None
See application file for complete search history.

(56) References Cited

U.S. PATENT DOCUMENTS 5,223,455 A * 6/1993 Itoh .................. H01L 21/28562
257/E21.171
6,726,955 B1 * 4/2004 Wang ................ H01L 21/02381
216/13
(Continued)

FOREIGN PATENT DOCUMENTS

JP    2000-195820 A    7/2000
JP    2004502299 A    1/2004
(Continued)

OTHER PUBLICATIONS

"Pulse." Merriam-Webster.com Dictionary, Merriam-Webster, https://www.merriam-webster.com/dictionary/pulse. (2020) (Year: 2020).*
(Continued)

*Primary Examiner* — Jose I Hernandez-Kenney
(74) *Attorney, Agent, or Firm* — Volpe Koenig (57) ABSTRACT

There is provided a technique that includes (a) supplying a first-element-containing gas to the substrate; (b) supplying a first reducing gas to the substrate; (c) supplying a second reducing gas, which is different from the first reducing gas, to the substrate; (d) supplying a third reducing gas, which is different from both the first reducing gas and the second reducing gas, to the substrate; (e) after a start of (a), performing (b) in parallel with (a); (f) in (e), performing (d) in parallel with (b); and (g) forming a first-element-containing film on the substrate by alternately performing (e) and (c) a predetermined number of times.

16 Claims, 6 Drawing Sheets

(51) Int. Cl.
*H01L 21/285* (2006.01)
*H01L 21/768* (2006.01)

(52) U.S. Cl.
CPC .. *H01L 21/76841* (2013.01); *C23C 16/45527* (2013.01); *C23C 16/45546* (2013.01)

(56) References Cited

U.S. PATENT DOCUMENTS

| | | | |
|---|---|---|---|
| 6,964,790 | B1* | 11/2005 | Nasu ................. C23C 16/14 427/253 |
| 2002/0197856 | A1* | 12/2002 | Matsuse ............ H01L 21/28061 257/E21.585 |
| 2003/0143841 | A1* | 7/2003 | Yang ................. C23C 16/515 438/653 |
| 2004/0043228 | A1* | 3/2004 | Derderian ............... H01L 29/06 428/457 |
| 2012/0003833 | A1* | 1/2012 | Khandelwal ...... C23C 16/45525 438/680 |
| 2013/0095668 | A1 | 4/2013 | Saito et al. |
| 2018/0216226 | A1* | 8/2018 | Ohashi ................. G03F 7/167 |
| 2019/0019673 | A1* | 1/2019 | Ogawa ................. C23C 16/347 |
| 2020/0194269 | A1 | 6/2020 | Ogawa et al. |
| 2021/0082753 | A1 | 3/2021 | Wakatsuki et al. |
| 2021/0388487 | A1* | 12/2021 | Ashitani ................. C23C 16/34 |
| 2022/0356565 | A1* | 11/2022 | Takahashi ............... C23C 16/34 |

FOREIGN PATENT DOCUMENTS

| | | |
|---|---|---|
| JP | 2011-252221 A | 12/2011 |
| JP | 2017-069407 A | 4/2017 |
| JP | 2018-188724 A | 11/2018 |
| JP | 2021-044492 A | 3/2021 |
| WO | 2019/058608 A1 | 3/2019 |
| WO | WO-2020175314 A1 * | 9/2020 ........... C23C 16/303 |

OTHER PUBLICATIONS

Taiwan Office Action issued on May 16, 2023 for Taiwan Patent Application No. 111122545.
Japanese Office Action issued on Apr. 18, 2023 for Japanese Patent Application No. 2021-128801.
Japanese Office Action issued on Oct. 3, 2023 for Japanese Patent Application No. 2021-128801.
Korean Office Action issued on Jul. 22, 2024 for Korean Patent Application No. 10-2022-0097266.

* cited by examiner

METHOD OF MANUFACTURING SEMICONDUCTOR DEVICE, SUBSTRATE PROCESSING APPARATUS, RECORDING MEDIUM, AND METHOD OF PROCESSING SUBSTRATE

CROSS-REFERENCE TO RELATED APPLICATION

This application is based upon and claims the benefit of priority from Japanese Patent Application No. 2021-128801, filed on Aug. 5, 2021, the entire contents of which are incorporated herein by reference.

TECHNICAL FIELD

The present disclosure relates to a method of manufacturing a semiconductor device, a substrate processing apparatus, a recording medium, and a method of processing a substrate.

BACKGROUND

In the related art, for example, a low resistance metal film is used as a word line of a 3D NAND flash memory or DRAM having a three-dimensional structure. In addition, a barrier film may be formed between the metal film and the insulating film.

When the barrier film is formed, a reaction by-product may be generated and may become an inhibitory factor for film formation. Therefore, a reducing gas may be supplied for the purpose of reducing the reaction by-product. However, the components of the reducing gas may be introduced into the film formed on the substrate.

SUMMARY

Some embodiments of the present disclosure provide a technique capable of improving the quality of a film formed on a substrate.

According to one embodiment of the present disclosure, there is provided a technique that includes (a) supplying a first-element-containing gas to the substrate; (b) supplying a first reducing gas to the substrate; (c) supplying a second reducing gas, which is different from the first reducing gas, to the substrate; (d) supplying a third reducing gas, which is different from both the first reducing gas and the second reducing gas, to the substrate; (e) after a start of (a), performing (b) in parallel with (a); (f) in (e), performing (d) in parallel with (b); and (g) forming a first-element-containing film on the substrate by alternately performing (e) and (c) a predetermined number of times.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to an ordinary skill in the art that the present disclosure may be practiced without these specific details. In other instances, well-known methods, procedures, systems, and components have not been described in detail so as not to unnecessarily obscure aspects of the various embodiments.

One embodiment of the present disclosure will now be described with reference to FIGS. 1 to 4. The drawings used in the following description are all schematic, and the dimensional relationship, ratios, and the like of various elements shown in figures do not always match the actual ones. Further, the dimensional relationship, ratios, and the like of various elements between plural figures do not always match each other.

(1) Configuration of Substrate Processing Apparatus

Figure 1:
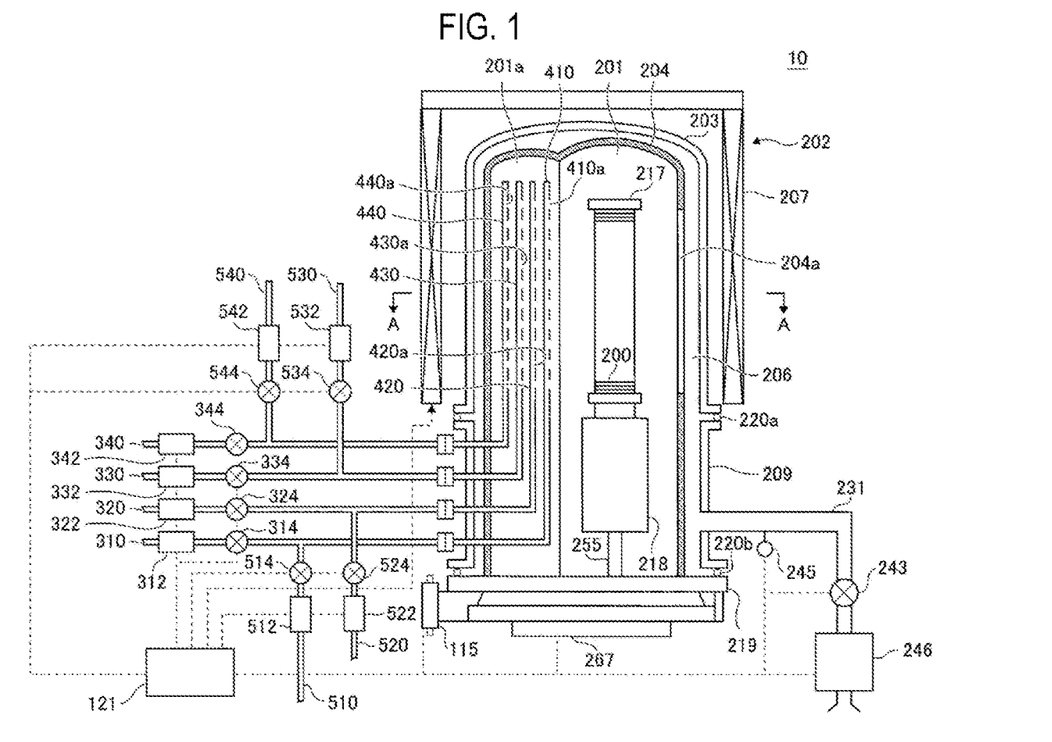
FIG. 1 is a vertical sectional view showing an outline of a vertical process furnace of a substrate processing apparatus according to an embodiment of the present disclosure.

A substrate processing apparatus 10 includes a process furnace 202 in which a heater 207 as a heating means (a heating mechanism or a heating system) is installed. The heater 207 has a cylindrical shape and is vertically installed by being supported by a heater base (not shown) as a support plate.

Inside the heater 207, an outer tube 203 constituting a process container is arranged concentrically with the heater 207. The outer tube 203 is made of, for example, a heat-resistant material such as quartz ($SiO_2$) or silicon carbide (SiC), and is formed in a cylindrical shape with its upper end closed and its lower end opened. Below the outer tube 203, a manifold (inlet flange) 209 is arranged concentrically with the outer tube 203. The manifold 209 is made of, for example, a metal material such as stainless steel (SUS) or the like, and is formed in a cylindrical shape with its upper and lower ends opened. An O-ring 220a as a seal member is installed between the upper end portion of the manifold 209 and the outer tube 203. By supporting the manifold 209 on the heater base, the outer tube 203 is installed vertically.

Inside the outer tube 203, an inner tube 204 constituting a process container is arranged. The inner tube 204 is made of, for example, a heat-resistant material such as quartz (SiO$_2$) or silicon carbide (SiC), and is formed in a cylindrical shape with its upper end closed and its lower end opened. A process container mainly includes the outer tube 203, the inner tube 204, and the manifold 209. A process chamber 201 is formed in a hollow cylindrical portion (inside the inner tube 204) of the process container.

The process chamber 201 is configured to accommodate wafers 200 as substrates in a state in which the wafers 200 are arranged in a horizontal posture and in multiple stages in a vertical direction by a boat 217 described later.

Figure 2:
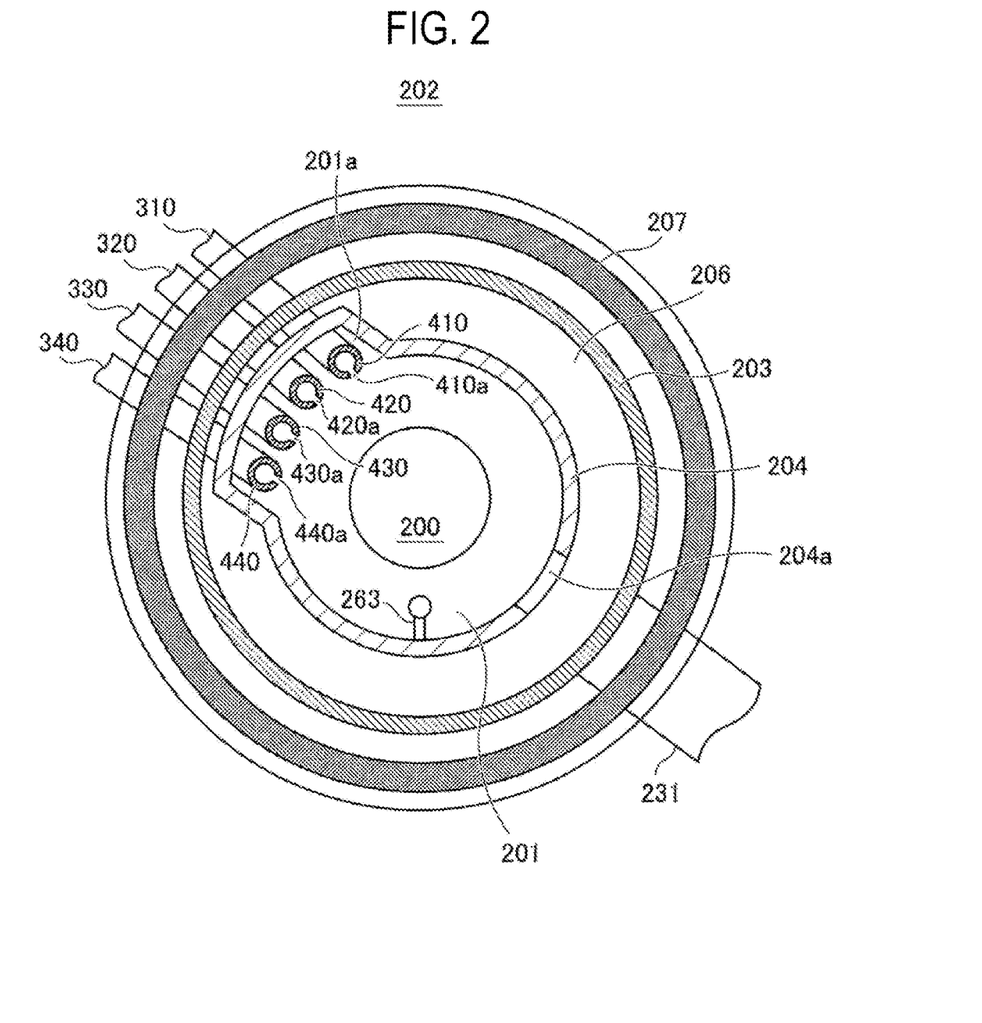
FIG. 2 is a schematic sectional view taken along line A-A in FIG. 1.

Nozzles 410, 420, 430 and 440 are installed in the process chamber 201 so as to penetrate the side wall of the manifold 209 and the inner tube 204. Gas supply pipes 310, 320, 330 and 340 are connected to the nozzles 410, 420, 430 and 440, respectively. However, the process furnace 202 of the present embodiment is not limited to the above-described embodiment.

Mass flow controllers (MFCs) 312, 322, 332 and 342, which are flow rate controllers (flow rate control parts), are installed in the gas supply pipes 310, 320, 330 and 340, respectively, sequentially from an upstream side. Further, valves 314, 324, 334 and 344, which are opening/closing valves, are installed in the gas supply pipes 310, 320, 330 and 340, respectively. Gas supply pipes 510, 520, 530, 540 for supplying an inert gas are connected to the gas supply pipes 310, 320, 330 and 340, respectively, on the downstream side of the valves 314, 324, 334 and 344. In the gas supply pipes 510, 520, 530, and 540, MFCs 512, 522, 532 and 542, which are flow rate controllers (flow rate control parts), and valves 514, 524, 534 and 544, which are opening/closing valves, are installed sequentially from the upstream side.

The nozzles 410, 420, 430 and 440 are connected to leading ends of the gas supply pipes 310, 320, 330 and 340, respectively. The nozzles 410, 420, 430 and 440 are configured as L-shaped nozzles, and the horizontal portions thereof are installed so as to penetrate the side wall of the manifold 209 and the inner tube 204. The vertical portions of the nozzles 410, 420, 430 and 440 are installed inside a channel-shaped (groove-shaped) preliminary chamber 201a formed to protrude outward in the radial direction of the inner tube 204 and extend in the vertical direction. The vertical portions of the nozzles 410, 420, 430 and 440 are installed in the preliminary chamber 201a so as to extend upward (toward the upper side in the arrangement direction of the wafers 200) along the inner wall of the inner tube 204.

The nozzles 410, 420, 430 and 440 are installed so as to extend from the lower region of the process chamber 201 to an upper region of the process chamber 201, and a plurality of gas supply holes 410a, 420a, 430a and 440a are formed at positions facing the wafers 200. As a result, process gases are supplied to the wafers 200 from the gas supply holes 410a, 420a, 430a and 440a of the respective nozzles 410, 420, 430 and 440. The gas supply holes 410a, 420a, 430a and 440a are installed from a lower portion of the inner tube 204 to an upper portion of the inner tube 204. The gas supply holes 410a, 420a, 430a and 440a have the same opening area. The gas supply holes 410a, 420a, 430a and 440a are installed at the same opening pitch. However, the gas supply holes 410a, 420a, 430a and 440a are not limited to the above-mentioned embodiment. For example, the opening area may be gradually increased from the lower portion to the upper portion of the inner tube 204. This makes it possible to make the flow rate of the gas supplied from the gas supply holes 410a, 420a, 430a and 440a more uniform.

The gas supply holes 410a, 420a, 430a and 440a of the nozzles 410, 420, 430 and 440 are installed at height positions from a lower portion of the boat 217 to the upper portion of the boat 217, which will be described later. Therefore, the process gases supplied into the process chamber 201 from the gas supply holes 410a, 420a, 430a and 440a of the nozzles 410, 420, 430 and 440 are supplied to the entire region of the wafers 200 accommodated from the lower portion to the upper portion of the boat 217. The nozzles 410, 420, 430 and 440 may be installed so as to extend from the lower region to the upper region of the process chamber 201. Specifically, the nozzles 410, 420, 430 and 440 may be installed so as to extend to the vicinity of the ceiling of the boat 217.

From the gas supply pipe 310, a first-element-containing gas containing a first element is supplied as the process gas into the process chamber 201 via the MFC 312, the valve 314 and the nozzle 410.

From the gas supply pipe 320, a first reducing gas is supplied as the process gas into the process chamber 201 via the MFC 322, the valve 324 and the nozzle 420.

From the gas supply pipe 330, a second reducing gas different from the first reducing gas is supplied as the process gas into the process chamber 201 via the MFC 332, the valve 334 and the nozzle 430. In the present disclosure, the second reducing gas is used as a reaction gas reacting with a precursor gas.

From the gas supply pipe 340, a third reducing gas different from both the first reducing gas and the second reducing gas is supplied as the process gas into the process chamber 201 via the MFC 342, the valve 344 and the nozzle 440.

From the gas supply pipes 510, 520, 530 and 540, an inert gas, for example, a nitrogen (N$_2$) gas is supplied into the process chamber 201 via the MFCs 512, 522, 532 and 542, the valves 514, 524, 543 and 544, and the nozzles 410, 420, 430 and 440, respectively. Hereinafter, an example in which the N$_2$ gas is used as the inert gas will be described. However, as the inert gas, for example, a rare gas such as an argon (Ar) gas, a helium (He) gas, a neon (Ne) gas, or a xenon (Xe) gas may be used in addition to the N$_2$ gas.

A process gas supply system mainly includes the gas supply pipes 310, 320, 330 and 340, the MFCs 312, 322, 332 and 342, the valves 314, 324, 334 and 344, and the nozzles 410, 420, 430 and 440. However, the process gas supply system may include only the nozzles 410, 420, 430 and 440. The process gas supply system may be simply referred to as a gas supply system. When the first-element-containing gas is allowed to flow from the gas supply pipe 310, a first-element-containing gas supply system mainly includes the gas supply pipe 310, the MFC 312, and the valve 314. The nozzle 410 may be included in the first-element-containing gas supply system. Further, when the first reducing gas is allowed to flow from the gas supply pipe 320, a first reducing gas supply system mainly includes the gas supply pipe 320, the MFC 322, and the valve 324. The nozzle 420 may be included in the first reducing gas supply system. Further, when the second reducing gas is allowed to flow from the gas supply pipe 330, a second reducing gas supply system mainly includes the gas supply pipe 330, the MFC 332, and the valve 334. The nozzle 430 may be included in the second reducing gas supply system. When the second reducing gas is supplied as a reaction gas from the gas supply pipe 330, the second reducing gas supply system may also be referred to as a reaction gas supply system. Further, when the third reducing gas is allowed to flow from the gas supply pipe 340, a third reducing gas supply system mainly includes the gas supply pipe 340, the MFC 342, and the valve 344. The nozzle 440 may be included in the third reducing gas supply system. In addition, an inert gas supply system mainly includes the gas supply pipes 510, 520, 530 and 540, the MFC 512, 522, 532 and 542, and the valves 514, 524, 534 and 544.

A method of supplying a gas in the present embodiment is to transfer a gas via the nozzles 410, 420, and 430 arranged in the preliminary chamber 201a in a vertically elongated annular space defined by the inner wall of the inner tube 204 and the ends of the plurality of wafers 200. Then, the gas is ejected into the inner tube 204 from the plurality of gas supply holes 410a, 420a, 430a and 440a installed at the positions of the nozzles 410, 420, 430 and 440 facing the wafers. More specifically, the process gas and the like is ejected in the direction parallel to the surface of the wafers 200 by the gas supply hole 410a of the nozzle 410, the gas supply hole 420a of the nozzle 420, the gas supply hole 430a of the nozzle 430, and the gas supply hole 440a of the nozzle 440.

An exhaust hole (exhaust port) 204a is a through-hole formed in the side wall of the inner tube 204 at a position facing the nozzles 410, 420, 430 and 440. For example, the exhaust hole 204a is a slit-shaped through-hole formed elongated in the vertical direction. The gas supplied into the process chamber 201 from the gas supply holes 410a, 420a, 430a and 440a of the nozzles 410, 420, 430 and 440 and flowing on the surfaces of the wafers 200 passes through the exhaust hole 204a and flows into an exhaust path 206 including a gap formed between the inner tube 204 and the outer tube 203. Then, the gas flowing into the exhaust path 206 is allowed to flow into an exhaust pipe 231 and is discharged to the outside of the process furnace 202.

The exhaust hole 204a is installed at a position facing the plurality of wafers 200. The gas supplied from the gas supply holes 410a, 420a, 430a and 440a to the vicinity of the wafers 200 in the process chamber 201 flows toward the horizontal direction and then flows into the exhaust path 206 through the exhaust hole 204a. The exhaust hole 204a is not limited to the slit-shaped through-hole, and may be configured by a plurality of holes.

The exhaust pipe 231 for exhausting an internal atmosphere of the process chamber 201 is installed in the manifold 209. A pressure sensor 245 which is a pressure detector (pressure detecting part) for detecting a pressure inside the process chamber 201, an APC (Auto Pressure Controller) valve 243, and a vacuum pump 246 as an vacuum-exhausting device are connected to the exhaust pipe 231 sequentially from the upstream side. The APC valve 243 can perform or stop a vacuum-exhausting operation in the process chamber 201 by opening or closing the valve while the vacuum pump 246 is actuated, and can also adjust the pressure inside the process chamber 201 by adjusting an opening degree of the valve while the vacuum pump 246 is actuated. An exhaust system mainly includes the exhaust hole 204a, the exhaust path 206, the exhaust pipe 231, the APC valve 243 and the pressure sensor 245. The vacuum pump 246 may be included in the exhaust system.

Below the manifold 209, a seal cap 219 is installed as a furnace opening lid capable of air-tightly closing a lower end opening of the manifold 209. The seal cap 219 is configured to abut on the lower end of the manifold 209 from the lower side in the vertical direction. The seal cap 219 is made of, for example, metal such as stainless steel (SUS) or the like, and is formed in a disk shape. An O-ring 220b as a seal member that comes into contact with the lower end of the manifold 209 is installed on the upper surface of the seal cap 219. On the opposite side of the seal cap 219 with respect to the process chamber 201, a rotator 267 for rotating the boat 217 that accommodates the wafers 200 is installed. A rotary shaft 255 of the rotator 267 penetrates the seal cap 219 and is connected to the boat 217. The rotator 267 is configured to rotate the wafers 200 by rotating the boat 217. The seal cap 219 is configured to be raised or lowered in the vertical direction by a boat elevator 115 as an elevator vertically installed outside the outer tube 203. The boat elevator 115 is configured to be able to load/unload the boat 217 into/out the process chamber 201 by raising or lowering the seal cap 219. The boat elevator 115 is configured as a transfer device (transfer mechanism) for transferring the boat 217 and the wafers 200, which are accommodated in the boat 217, into/out of the process chamber 201.

The boat 217 as a substrate support is configured to arrange a plurality of wafers, for example, 25 to 200 wafers 200, at intervals in the vertical direction in a horizontal posture with the centers of the wafers 200 aligned with each other. The boat 217 is made of, for example, a heat-resistant material such as quartz or SiC. Below the boat 217, heat insulating plates 218 made of, for example, a heat-resistant material such as quartz or SiC are installed in a horizontal posture in multiple stages (not shown). With this configuration, the heat from the heater 207 is less likely to be transferred to the seal cap 219. However, the present embodiment is not limited to the above-described form. For example, instead of installing the heat insulating plates 218 below the boat 217, a heat insulating cylinder configured as a cylindrical-shape member made of a heat-resistant material such as quartz or SiC may be installed.

As shown in FIG. 2, a temperature sensor 263 as a temperature detector is installed in the inner tube 204. A degree of conducting electricity to the heater 207 is adjusted based on the temperature information detected by the temperature sensor 263, so that the temperature in the process chamber 201 becomes a desired temperature distribution. The temperature sensor 263 is configured in an L-shape, like the nozzles 410, 420, 430 and 440, and is installed along the inner wall of the inner tube 204.

Figure 3:
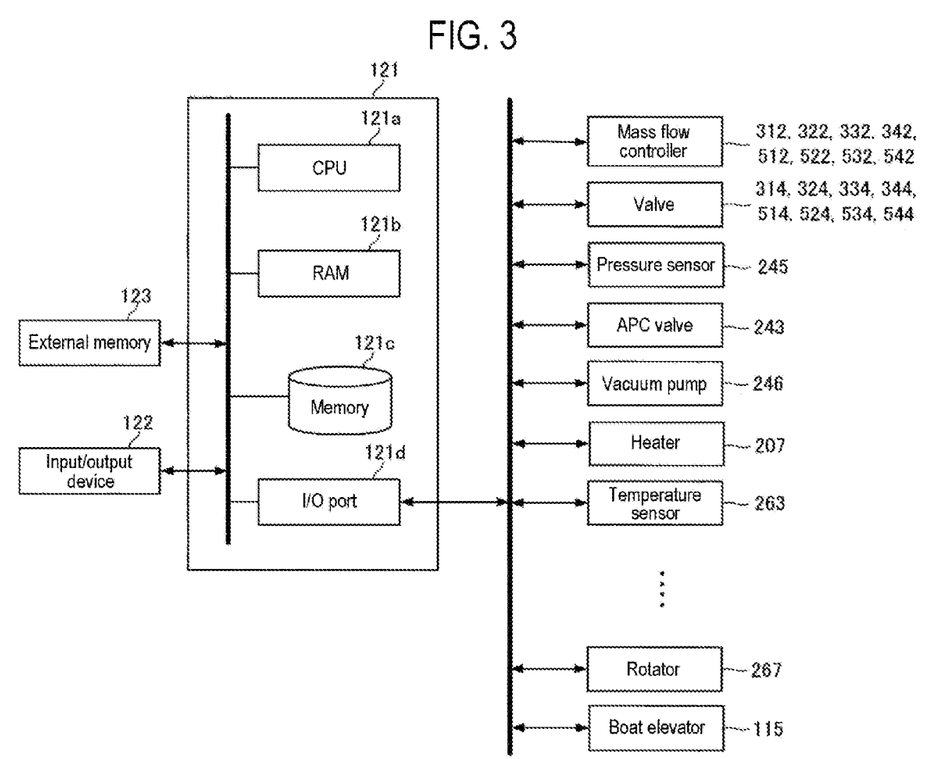
FIG. 3 is a schematic configuration diagram of a controller of a substrate processing apparatus according to an embodiment of the present disclosure, in which the control system of the controller is shown in a block diagram.

As shown in FIG. 3, the controller 121, which is a control part (control means), may be configured as a computer including a CPU (Central Processing Unit) 121a, a RAM (Random Access Memory) 121b, a memory 121c, and an I/O port 121d. The RAM 121b, the memory 121c, and the I/O port 121d are configured to be capable of exchanging data with the CPU 121a via an internal bus. An input/output device 122 configured as, for example, a touch panel or the like is connected to the controller 121.

The memory 121c includes, for example, a flash memory, an HDD (Hard Disk Drive), or the like. The memory 121c readably stores a control program for controlling the operation of the substrate processing apparatus, a process recipe in which procedures and conditions of the below-described method of manufacturing a semiconductor device are described, and the like. The process recipe is a combination for causing the controller 121 to execute each step in the below-described method of manufacturing a semiconductor device to obtain a predetermined result. The process recipe functions as a program. Hereinafter, the process recipe, the control program, and the like may be generally and simply referred to as a "program." When the term "program" is used herein, it may indicate a case of including the process recipe only, a case of including the control program only, or a case of including both the process recipe and the control program. The RAM 121b is configured as a memory area (work area) in which programs, data, and the like read by the CPU 121a are temporarily held.

The I/O port 121d is connected to the MFCs 312, 322, 332, 342, 512, 522, 532 and 542, the valves 314, 324, 334, 344, 514, 524, 534 and 544, the pressure sensor 245, the APC valve 243, the vacuum pump 246, the heater 207, the temperature sensor 263, the rotator 267, the boat elevator 115, and the like.

The CPU 121a is configured to read the control program from the memory 121c and execute the same. The CPU 121a is also configured to read the recipe or the like from the memory 121c in response to an input of an operation command from the input/output device 122 or the like. The CPU 121a is configured to be capable of controlling, according to the contents of the read recipe, the flow rate adjustment operations for various types of gases by the MFCs 312, 322, 332, 342, 512, 522, 532 and 542, the opening/closing operations of the valves 314, 324, 334, 344, 514, 524, 543 and 544, the opening/closing operation of the APC valve 243, the pressure regulation operation by the APC valve 243 based on the pressure sensor 245, the temperature control operation performed by the heater 207 based on the temperature sensor 263, the actuating and stopping of the vacuum pump 246, the rotation and rotation speed adjustment operation for the boat 217 by the rotator 267, the raising or lowering operation for the boat 217 by the boat elevator 115, the operation of accommodating the wafers 200 in the boat 217, and the like.

The controller 121 can be configured by installing, in a computer, the above-mentioned program stored in an external memory (e.g., a magnetic tape, a magnetic disk such as a flexible disk or a hard disk, an optical disk such as a CD or a DVD, a magneto-optical disk such as a MO or the like, and a semiconductor memory such as a USB memory or a memory card) 123. The memory 121c and the external memory 123 are configured as a computer-readable recording medium. Hereinafter, the memory 121c and the external memory 123 may be generally and simply referred to as a "recording medium." When the term "recording medium" is used herein, the recording medium may include a case of including the memory 121c only, a case of including the external memory 123 only, or a case of including both the memory 121c and the external memory 123. The program may be provided to the computer by using a communication means such as the Internet or a dedicated line without using the external memory 123.

(2) Substrate Processing Process (Substrate Processing Method)

As a process of manufacturing a semiconductor device, an example of a process of forming a first-element-containing film containing a first element on a wafer 200 will be described with reference to FIG. 4. This process is performed using the process furnace 202 of the substrate processing apparatus 10 described above. In the following description, the operation of various parts constituting the substrate processing apparatus 10 are controlled by the controller 121.

A substrate processing process (a process of manufacturing semiconductor device) according to the present embodiment includes:

(a) supplying a first-element-containing gas to a wafer 200;
(b) supplying a first reducing gas to the wafer 200;
(c) supplying a second reducing gas to the wafer 200;
(d) supplying a third reducing gas to the wafer 200;
(e) after the start of (a), performing (b) in parallel with (a);
(f) in (e), performing (d) in parallel with (b); and
(g) forming a first-element-containing film on the wafer 200 by alternately performing (e) and (c) a predetermined number of times.

When the term "wafer" is used in the present disclosure, it may refer to "a wafer itself" or "a wafer and a laminated body of certain layers or film formed on the surface of the wafer." When the phrase "a surface of a wafer" is used herein, it may refer to "a surface of a wafer itself" or "a surface of a certain layer or film formed on a wafer." When the term "substrate" is used herein, it may be synonymous with the term "wafer."

(Wafer Loading)

When a plurality of wafers 200 are charged on the boat 217 (wafer charging), as shown in FIG. 1, the boat 217 supporting the plurality of wafers 200 is lifted up by the boat elevator 115 and is loaded into the process chamber 201 of the process container (boat loading), whereby the boat 217 is accommodated in the process container. In this state, the seal cap 219 seals the lower end opening of the outer tube 203 via the O-ring 220.

(Pressure Regulation and Temperature Control)

The inside of the process chamber 201, i.e., the space where the wafers 200 exist, is vacuum-exhausted by the vacuum pump 246 to reach a desired pressure (vacuum degree). In this operation, the pressure in the process chamber 201 is measured by the pressure sensor 245, and the APC valve 243 is feedback-controlled based on the measured pressure information (pressure regulation). The vacuum pump 246 is always kept in operation until at least the processing for the wafers 200 is completed. Further, the inside of the process chamber 201 is heated by the heater 207 to reach a desired temperature. In this operation, the degree of conducting electricity to the heater 207 is feedback-controlled based on the temperature information detected by the temperature sensor 263 so that the inside of the process chamber 201 has a desired temperature distribution (temperature control). The inside of the process chamber 201 is continuously heated by the heater 207 at least until the processing on the wafers 200 is completed.

(Supply of First-Element-Containing Gas, Step S10)

The valve 314 is opened to allow a first-element-containing gas to flow into the gas supply pipe 310. The first-element-containing gas whose flow rate is adjusted by the MFC 312 is supplied into the process chamber 201 from the gas supply holes 410a of the nozzle 410 and exhausted from the exhaust pipe 231.

At this time, the APC valve 243 is adjusted so that the pressure in the process chamber 201 is set to, for example, a pressure in the range of 1 to 3990 Pa. The supply flow rate of the first-element-containing gas controlled by the MFC 312 is set to, for example, a flow rate in the range of 0.01 to 3 slm. In the following, a temperature of the heater 207 is set such that the temperature of the wafers 200 is in the range of, for example, 200 to 600 degrees C. The notation of a numerical range such as "1 to 3990 Pa" in the present disclosure means that the lower limit value and the upper limit value are included in the range. Therefore, for example, "1 to 3990 Pa" means "1 Pa or more and 3990 Pa or less". The same applies to other numerical ranges.

At this time, the first-element-containing gas is supplied to the wafers 200. As the first-element-containing gas, it may be possible to use a gas containing a first element and a halogen, for example, a titanium tetrachloride ($TiCl_4$) gas containing titanium (Ti) and chlorine (Cl). When the $TiCl_4$ gas is used as the first-element-containing gas, by supplying the $TiCl_4$ gas, $TiCl_x$ (where x is an integer of 4 or less) is adsorbed on the wafer 200 (a base film on the surface of the wafer 200), and a Ti-containing layer is formed.

(Simultaneous Supply of First-Element-Containing Gas, First Reducing Gas and Third Reducing Gas, Step S11)

After a lapse of a predetermined time from the start of the supply of the first-element-containing gas, the valve 324 and the valve 344 are opened to allow the first reducing gas and the third reducing gas to flow into the gas supply pipe 320 and the gas supply pipe 340, respectively. That is, after the supply of the first-element-containing gas is started, the supply of the first reducing gas is started in parallel with the supply of the first-element-containing gas. Then, the third reducing gas is supplied in parallel with the supply of the first reducing gas. That is, in a state in which the first-element-containing gas is supplied, the supply of the first reducing gas and the supply of the third reducing gas are started at the same time during the supply of the first-element-containing gas. The flow rate of the first reducing gas is adjusted by the MFC 322. The first reducing gas is supplied into the process chamber 201 from the gas supply holes 420a of the nozzle 420 and is exhausted from the exhaust pipe 231. The flow rate of the third reducing gas is adjusted by the MFC 342. The third reducing gas is supplied into the process chamber 201 from the gas supply holes 440a of the nozzle 440 and is exhausted from the exhaust pipe 231.

At this time, the APC valve 243 is adjusted so that the pressure in the process chamber 201 is set to, for example, a pressure in the range of 1 to 3990 Pa. The supply flow rate of the first reducing gas controlled by the MFC 322 is set to, for example, a flow rate within the range of 0.1 to 5 slm. The supply flow rate of the third reducing gas controlled by the MFC 342 is set to, for example, a flow rate within the range of 1 to 10 slm. The time for supplying the first-element-containing gas, the first reducing gas and the third reducing gas to the wafer 200 at the same time is set to, for example, a time in the range of 0.01 to 70 seconds.

At this time, the first-element-containing gas, the first reducing gas and the third reducing gas are supplied to the wafer 200. That is, at least the first-element-containing gas, the first reducing gas and the third reducing gas have a timing at which they are supplied at the same time. As the first reducing gas, it may be possible to use, for example, a silane ($SiH_4$) gas, which is a gas containing silicon (Si) and hydrogen (H). As the third reducing gas, it may be possible to use, for example, a hydrogen ($H_2$) gas, which is a gas containing hydrogen (H).

By supplying the first reducing gas in this way, for example, hydrogen chloride (HCl), which is a reaction by-product and which is an adsorption inhibitive gas that inhibits film formation, is removed. Then, an adsorption site on which the reaction by-product such as HCl or the like was adsorbed becomes vacant, and an adsorption site on which the first element such as $TiCl_x$ or the like can be adsorbed is formed on the surface of the wafer 200. Further, by supplying the third reducing gas in parallel with the supply of the first reducing gas, it is possible to suppress the decomposition of the first reducing gas remaining in the process chamber 201. That is, it is possible to prevent the element contained in the first reducing gas from being introduced into the film. Specifically, when a $SiH_4$ gas is used as the first reducing gas, it is possible to suppress a decomposition reaction in which $SiH_4$ is decomposed into Si and $2H_2$, and it is possible to prevent Si from being introduced into a titanium nitride (TiN) film which is a first-element-containing film.

(Simultaneous Supply of First Reducing Gas and Third Reducing Gas, Step S12)

After a predetermined time has elapsed from the start of the supply of the first-element-containing gas, the valve 314 is closed to stop the supply of the first-element-containing gas. In other words, after a predetermined time has elapsed from the start of the supply of the first reducing gas and the third reducing gas, in a state of supplying the first reducing gas and the third reducing gas, the supply of the first-element-containing gas is stopped during the supply of the first reducing gas and the third reducing gas.

At this time, the APC valve 243 is adjusted so that the pressure in the process chamber 201 is set to, for example, a pressure in the range of 1 to 3990 Pa. The time for simultaneously supplying the first reducing gas and the third reducing gas to the wafer 200 is set to, for example, a time within the range of 0.1 to 30 seconds.

At this time, the first reducing gas and the third reducing gas are supplied to the wafer 200.

In this way, by stopping the supply of the first-element-containing gas while supplying the first reducing gas, and stopping the supply of the first reducing gas after the supply of the first-element-containing gas is stopped, it is possible to reduce the amount of reaction by-products remaining in the process chamber 201 and to improve the film quality of, for example, a titanium nitride (TiN) film, which is a first-element-containing film.

(Simultaneous Supply of Third Reducing Gas and Inert Gas (Purge), Step S13)

After a predetermined time has elapsed from the start of the supply of the first reducing gas, the valve 324 is closed to stop the supply of the first reducing gas. At this time, the valves 514, 524, 534 and 544 are opened to allow the inert gas to flow into the gas supply pipes 510, 520, 530 and 540 (Purge). That is, the inert gas is supplied into the process chamber 201. The inert gas is, for example, an $N_2$ gas, which acts as a purge gas.

In other words, after a predetermined time has elapsed from the start of the supply of the first reducing gas and the third reducing gas, in a state of supplying the third reducing gas, the supply of the first reducing gas is stopped and the supply of the inert gas is started while supplying the third reducing gas. That is, the supply of the third reducing gas continues after the supply of the first reducing gas is stopped. That is, the third reducing gas is supplied in parallel with the supply of the inert gas.

At this time, the APC valve 243 is adjusted so that the pressure in the process chamber 201 is set to, for example, a pressure in the range of 1 to 3990 Pa. The supply flow rate of the inert gas controlled by the MFC 512, 522, 532 and 542 is set to a flow rate in the range of, for example, 0.1 to 30 slm, respectively. At this time, the time for simultaneously supplying the third reducing gas and the inert gas to the wafer 200 is set to, for example, a time within the range of 0.1 to 30 seconds.

At this time, the third reducing gas and the inert gas are simultaneously supplied into the process chamber 201. As described above, by continuously supplying the third reducing gas after the supply of the first reducing gas is stopped, it is possible to suppress the decomposition of the first reducing gas remaining in the process chamber 201. Further, by supplying the third reducing gas in parallel with the supply of the inert gas, it is possible to reduce the amount of the first reducing gas, for example, $SiH_4$ or decomposition products remaining in the process chamber 201.

(Exhaust, Step S14)

After a predetermined time has elapsed from the start of the supply of the inert gas, the valves 514, 524, 534 and 544 are closed to stop the supply of the inert gas. At this time, the APC valve 243 of the exhaust pipe 231 is opened, and the inside of the process chamber 201 is vacuum-exhausted by the vacuum pump 246. Therefore, a residual gas is removed from the wafer 200, and the gas, the reaction by-products, and the like remaining in the process chamber 201 are excluded from the process chamber 201. Thus, the residual gas can be removed from the wafer 200, and the amount of the first reducing gas or the decomposition products remaining in the process chamber 201 can be reduced. At this time, the time for vacuum-exhausting the inside of the process chamber 201 is set to, for example, a time within the range of 0.1 to 30 seconds.

(Supply of Inert Gas (Purge), Step S15)

After a predetermined time has elapsed from the start of exhaust, the valves 514, 524, 534 and 544 are opened to allow the inert gas to flow into the gas supply pipes 510, 520, 530 and 540 (purge). That is, the inert gas is supplied into the process chamber 201.

At this time, the APC valve 243 is adjusted so that the pressure in the process chamber 201 is set to, for example, a pressure in the range of 1 to 3990 Pa. The supply flow rate of the inert gas controlled by the MFC 512, 522, 532 and 542 is set to a flow rate in the range of, for example, 0.1 to 30 slm, respectively. At this time, the time for supplying the inert gas to the wafer 200 is set to, for example, a time in the range of 0.1 to 30 seconds.

At this time, the inert gas is supplied into the process chamber 201. As a result, it is possible to reduce the amount of the first reducing gas or the decomposition products remaining in the process chamber 201.

(Supply of Second Reducing Gas, Step S16)

After a predetermined time has elapsed from the start of the supply of the inert gas, the valves 514, 524, 534 and 544 are closed to stop the supply of the inert gas. At this time, the valve 334 is opened to allow the second reducing gas to flow into the gas supply pipe 330. The flow rate of the second reducing gas is adjusted by the MFC 332. The second reducing gas is supplied into the process chamber 201 through the gas supply holes 430a of the nozzle 430 and is exhausted from the exhaust pipe 231.

At this time, the APC valve 243 is adjusted so that the pressure in the process chamber 201 is set to, for example, a pressure in the range of 1 to 3990 Pa. The supply flow rate of the second reducing gas controlled by the MFC 332 is, for example, a flow rate within the range of 0.1 to 30 slm. The time for supplying the second reducing gas to the wafer 200 is set to, for example, a time in the range of 0.01 to 30 seconds.

At this time, the second reducing gas is supplied to the wafer 200. In this regard, as the second reducing gas, it may be possible to use, for example, an ammonia ($NH_3$) gas. When the $NH_3$ gas is used as the second reducing gas, it undergoes a substitution reaction with at least a part of the Ti-containing layer formed on the wafer 200. During the substitution reaction, Ti contained in the Ti-containing layer and N contained in the $NH_3$ gas are bonded to form a TiN layer on the wafer 200. Specifically, when TiCl adsorbed on the wafer 200 reacts with $NH_3$, a TiN film is formed on the wafer 200, and the coverage of the TiN film can be improved. Further, during the substitution reaction, reaction by-products such as HCl, ammonium chloride ($NH_4Cl$), $H_2$ and the like are produced.

(Supply of Inert Gas (Purge), Step S17)

After a predetermined time has elapsed from the start of the supply of the second reducing gas, the valve 334 is closed to stop the supply of the second reducing gas. At this time, the valves 514, 524, 534 and 544 are opened to allow the inert gas to flow into the gas supply pipes 510, 520, 530 and 540 (Purge). That is, the inert gas is supplied into the process chamber 201.

At this time, the APC valve 243 is adjusted so that the pressure in the process chamber 201 is set to, for example, a pressure in the range of 1 to 3990 Pa. The supply flow rate of the inert gas controlled by the MFC 512, 522, 532 and 542 is set to a flow rate in the range of, for example, 0.1 to 30 slm, respectively. At this time, the time for supplying the inert gas to the wafer 200 is set to, for example, a time in the range of 0.1 to 30 seconds.

At this time, the inert gas is supplied into the process chamber 201. This makes it possible to reduce the second reducing gas unreacted or contributed to the formation of the film and the reaction by-products, which remain in the process chamber 201.

(Exhaust, Step S18)

After a predetermined time has elapsed from the start of the supply of the inert gas, the valves 514, 524, 534 and 544 are closed to stop the supply of the inert gas. At this time, the APC valve 243 of the exhaust pipe 231 is opened, and the inside of the process chamber 201 is vacuum-exhausted by the vacuum pump 246. Therefore, the residual gas is removed from the wafer 200, and the second reducing gas unreacted or contributed to the formation of the film and the reaction by-products, which remain in the process chamber 201 are excluded from the process chamber 201. At this time, the time for vacuum-exhausting the inside of the process chamber 201 is set to, for example, a time within the range of 0.1 to 30 seconds.

(Supply of Inert Gas (Purge), Step S19)

After a predetermined time has elapsed from the start of exhaust, the valves 514, 524, 534 and 544 are opened to allow the inert gas to flow into the gas supply pipes 510, 520, 530 and 540 (purge). That is, the inert gas is supplied into the process chamber 201.

At this time, the APC valve 243 is adjusted so that the pressure in the process chamber 201 is set to, for example, a pressure in the range of 1 to 3990 Pa. The supply flow rate of the inert gas controlled by the MFC 512, 522, 532 and 542 is set to a flow rate in the range of, for example, 0.1 to 30 slm, respectively. At this time, the time for supplying the inert gas to the wafer 200 is set to, for example, a time in the range of 0.1 to 30 seconds.

At this time, the inert gas is supplied into the process chamber 201. This makes it possible to reduce the second reducing gas unreacted or contributed to the formation of the film and the reaction by-products, which remain in the process chamber 201.

(Implemented a Predetermined Number of Times)

By executing a cycle of sequentially performing the above-mentioned steps S10 to S19 a predetermined number of times (n times), for example, once or more, a first-element-containing film having a predetermined thickness is formed on the wafer 200. In other words, by alternately performing the step of supplying the first reducing gas in parallel with the supply of the first-element-containing gas after the supply of the first-element-containing gas is started and the step of supplying the second reducing gas, a predetermined number of times, a first-element-containing film having a predetermined thickness is formed on the wafer 200. In this case, for example, a titanium nitride (TiN) film is formed.

In the case of film-forming process, for example, the TiN film, HCl is produced as a reaction by-product in the film forming process, and this reaction by-product may be a factor that inhibits the film formation. Thus, a reducing gas such as a $SiH_4$ gas or the like is supplied for the purpose of reducing and discharging HCl. However, for example, the $SiH_4$ gas begins to undergo thermal decomposition at about 380 degrees C., and the thermal decomposition becomes intense at 500 degrees C. or higher. Therefore, if the process is performed at a high temperature, $SiH_4$ may be decomposed and Si may be introduced into the TiN film.

As shown in steps S10 to S19 described above, by supplying the third reducing gas that suppresses the thermal decomposition of the first reducing gas at the time of supplying the first reducing gas and in the purge step after supplying the first reducing gas, the thermal decomposition of the first reducing gas is suppressed, and the film formation temperature can be raised. Specifically, for example, by supplying an $H_2$ gas that suppresses the thermal decomposition of the $SiH_4$ gas at the time of supplying the $SiH_4$ gas and in the purge step after supplying the $SiH_4$ gas, the thermal decomposition of the $SiH_4$ is suppressed and the film formation temperature can be raised.

(After-Purge and Returning Atmospheric Pressure)

An inert gas is supplied from each of the gas supply pipes 510 to 540 into the process chamber 201 and exhausted from the exhaust pipe 231. The inert gas acts as a purge gas, whereby the inside of the process chamber 201 is purged with the inert gas, and the gas and reaction by-products remaining in the process chamber 201 are removed from the inside of the process chamber 201 (after-purge). Thereafter, the atmosphere in the process chamber 201 is replaced with the inert gas (purge gas replacement), and the pressure in the process chamber 201 is returned to the atmospheric pressure (returning to atmospheric pressure).

(Wafer Unloading)

Thereafter, the seal cap 219 is lowered by the boat elevator 115, and the lower end of the outer tube 203 is opened. Then, the processed wafers 200 are unloaded from the lower end of the outer tube 203 to the outside of the outer tube 203 while being supported by the boat 217 (boat unloading). Thereafter, the processed wafers 200 is discharged from the boat 217 (wafer discharging).

(3) Effects of the Present Embodiment

According to the present embodiment, one or more of the following effects may be obtained.
(a) The reaction by-products serving as a factor that inhibits film formation can be removed.
(b) The decomposition of the first reducing gas can be suppressed.
(c) The amount of the first reducing gas or the decomposition products remaining in the process chamber can be reduced.
(d) The decomposition of the first reducing gas remaining in the process chamber can be suppressed.
(e) That is, it is possible to prevent the decomposition products from being introduced into the film formed on the substrate.
(f) Therefore, the film quality of the film formed on the substrate can be improved.

(4) Other Embodiments

The embodiment of the present disclosure has been specifically described above. However, the present disclosure is not limited to the above-described embodiment, and various modifications can be made without departing from the gist thereof.

(Modification 1)

Figure 4:
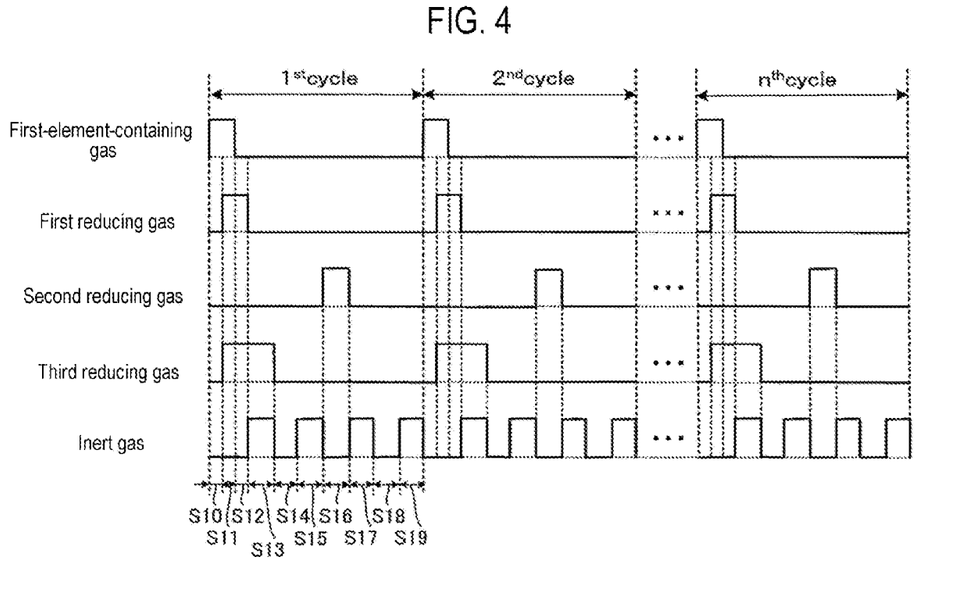
FIG. 4 is a diagram showing a substrate processing sequence in an embodiment of the present disclosure.
Figure 5:
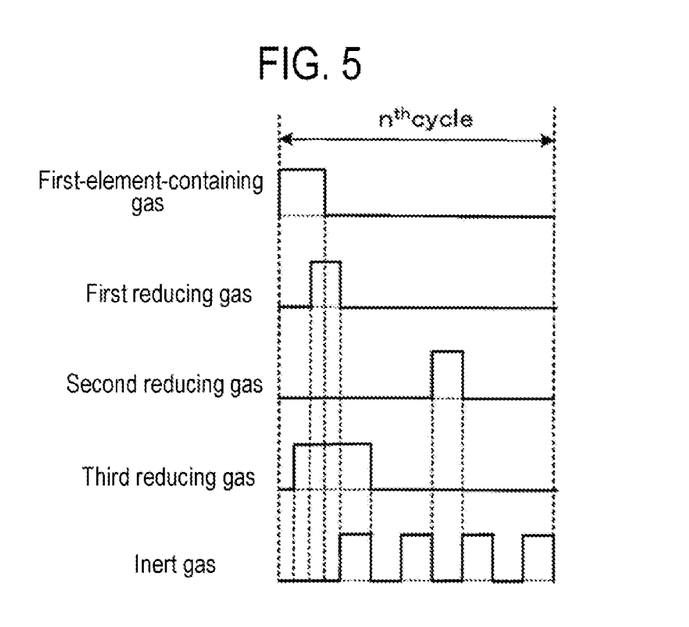
FIG. 5 is a diagram showing a modification of the substrate processing sequence in an embodiment of the present disclosure.

FIG. 5 shows a modification of the substrate processing sequence according to an embodiment of the present disclosure. In this modification, the third reducing gas is supplied before the supply of the first reducing gas. That is, the supply of the third reducing gas is started before starting the supply of the first reducing gas. By supplying the third reducing gas before the supply of the first reducing gas, the inside of the process chamber 201 can be kept in the atmosphere of the third reducing gas before supplying the first reducing gas, and the start of decomposition of the first reducing gas can be delayed. That is, the decomposition of the first reducing gas can be controlled, and the uniformity of each substrate processing process can be improved. Further, in this case, the same effects as those of the above-described substrate processing sequence shown in FIG. 4 can be obtained. That is, it is possible to prevent the decomposition product of the first reducing gas from being introduced into the film and to improve the film quality of the film formed on the substrate.

For example, when using the $SiH_4$ gas as the first reducing gas and the $H_2$ gas as the third reducing gas and supplying the $H_2$ gas and the $SiH_4$ gas simultaneously, it becomes unclear which gas first reaches into the process chamber 201, and thus it becomes difficult to precisely control the suppression of the decomposition. For example, an amount of decomposition of $SiH_4$ differs for each cycle or each substrate processing process, and the film quality may differ. By starting the supply of the $H_2$ gas before the start of supply of the $SiH_4$ gas as in modification 1, the inside of the process chamber 201 can be kept in an $H_2$ atmosphere, and the start of decomposition of $SiH_4$ can be delayed. That is, by supplying the $H_2$ gas first, it is possible to control the decomposition of $SiH_4$ and to improve the uniformity of each substrate processing process.

(Modification 2)

Figure 6:
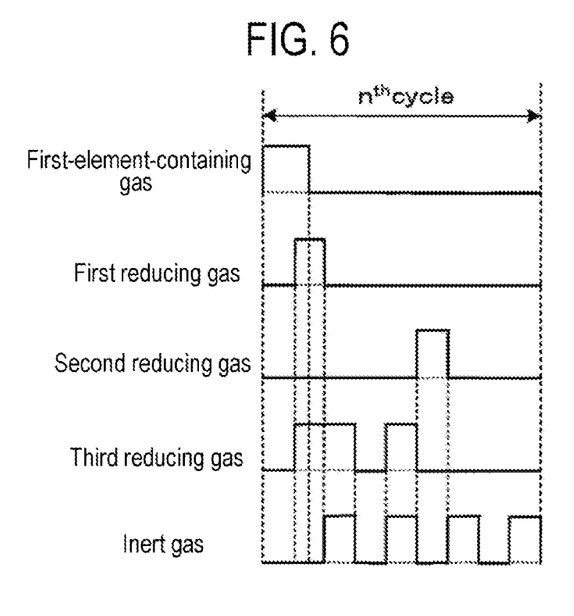
FIG. 6 is a diagram showing a modification of the substrate processing sequence in an embodiment of the present disclosure.

FIG. 6 shows another modification of the substrate processing sequence according to an embodiment of the present disclosure. In this modification, the third reducing gas is supplied in parallel with the inert gas when the inert gas is supplied in step S15 after the exhaust in step S14 described above. That is, after the inside of the process chamber 201 is vacuum-exhausted, the third reducing gas and the inert gas are simultaneously supplied into the process chamber 201. This makes it possible to further suppress the decomposition of the first reducing gas remaining in the process chamber 201. Therefore, the uniformity for each substrate processing process can be improved. Further, in this case, the same effects as those of the above-described substrate processing sequence shown in FIG. 4 can be obtained. That is, it is possible to prevent the decomposition product of the first reducing gas from being introduced into the film and to improve the film quality of the film formed on the substrate.

(Modification 3)

Figure 7:
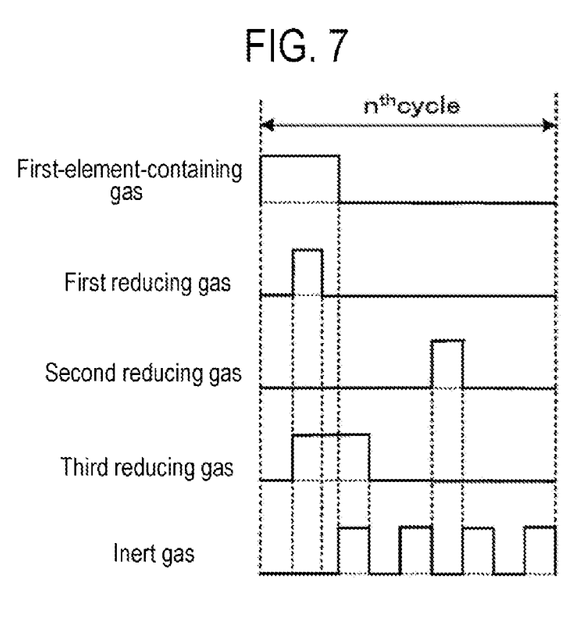
FIG. 7 is a diagram showing a modification of the substrate processing sequence in an embodiment of the present disclosure.

FIG. 7 shows a further modification of the substrate processing sequence according to an embodiment of the present disclosure. In this modification, the supply of the first-element-containing gas is stopped after stopping the supply of the first reducing gas. That is, after supplying the first reducing gas, the supply of the first-element-containing gas is continuously performed. In this case, the same effects as those of the above-described substrate processing sequence shown in FIG. 4 can be obtained. That is, it is possible to prevent the decomposition product of the first reducing gas from being introduced into the film and to improve the film quality of the film formed on the substrate.

Further, in the above-described embodiment, the case where the TiCl$_4$ gas containing Ti and Cl is used as the first-element-containing gas has been described. However, the present disclosure is not limited thereto. As the first-element-containing gas, it may be possible to use a gas containing a first element and a halogen. The first element is, for example, at least one selected from the group of zirconium (Zr), hafnium (Hf), molybdenum (Mo), ruthenium (Ru), aluminum (Al), gallium (Ga), Si, germanium (Ge), and the like. The halogen is, for example, at least one selected from the group of chlorine (CO, fluorine (F), and bromine (Br). The first-element-containing gas in which the halogen is chlorine is referred to as a first-element- and chlorine-containing gas. The present disclosure may be suitably applied to a case when such a gas described above is used.

Further, in the above-described embodiment, the case where the SiH$_4$ gas is used as the first reducing gas has been described. However, the present disclosure is not limited thereto, and a gas containing a second element and hydrogen (H) may be used as the first reducing gas. In the present disclosure, such a gas is also referred to as a hydrogen-containing gas, a second-element-containing reducing gas, or a second-element- and hydrogen-containing gas. The second element includes, for example, at least one or more of the 13th group elements and the 14th group elements of the periodic table. Examples of such a gas include a silane-based gas such as disilane (Si$_2$H$_6$), trisilane (Si$_3$H$_8$) or the like, and a borane-based gas such as monoborane (BH), diborane (B$_2$H$_6$) or the like. The present disclosure may also be suitably applied a case where when one or more of these gases are used.

Further, in the above-described embodiment, the case where the NH$_3$ gas is used as the second reducing gas has been described. However, the present disclosure is not limited thereto, and the second reducing gas may be a gas containing hydrogen (H). For example, the present disclosure may be suitably applied to a case where a nitrogen-containing gas such as diazene (N$_2$H$_2$), triazene (N$_3$H$_3$), hydrazine (N$_2$H$_4$) or the like is used. Further, when a film made of an elemental metal instead of a nitride film is formed as the film to be formed on the substrate, it may be possible to use a hydrogen-containing gas that does not contain nitrogen. The hydrogen-containing gas that does not contain nitrogen may be a H$_2$ gas, a deuterium (D$_2$) gas, or the like.

Further, in the above-described embodiment, the case where the H$_2$ gas is used as the third reducing gas has been described. However, the present disclosure is not limited thereto, and may be suitably applied to, for example, a case where a deuterium (D$_2$) gas or the like is used as the third reducing gas. Specifically, a gas composed of a hydrogen element is used as the third reducing gas.

Further, in the above-described embodiment, the example where the supply of the first reducing gas continues after the supply of the first-element-containing gas (FIGS. 4, 5, and 6) and the example in which the supply of the first reducing gas is stopped before stopping the supply of the first-element-containing gas (FIG. 7) have been described. However, the present disclosure is not limited thereto. For example, the timing of the end of supply of the first-element-containing gas may be matched with the timing of the end of supply of the first reducing gas. Further, the timing of the end of supply of the third reducing gas may be matched with the timing of the end of supply of the first reducing gas. Even in such a case, at least one of the effects of the present disclosure can be obtained.

Further, in the above-described embodiment, the example where the film is formed using the substrate processing apparatus which is a batch-type vertical apparatus for processing a plurality of substrates at one time has been described. However, the present disclosure is not limited thereto. The present disclosure may also be suitably applied to a case where a film is formed using a single-wafer type substrate processing apparatus for processing one or several substrates at a time.

A process recipe (a program that describe processing procedures, processing conditions, etc.) used for forming various thin films may be prepared individually (in a multiple number) according to the contents of the substrate processing process (film type, composition ratio, film quality, film thickness, processing procedure, processing condition and the like of the thin film to be formed). When starting the substrate processing process, a proper recipe may be appropriately selected from a plurality of process recipes according to the contents of the substrate processing process. Specifically, the plurality of process recipes individually prepared according to the contents of the substrate processing process may be stored (installed) in the memory 121c of the substrate processing apparatus in advance via a telecommunication line or a recording medium (the external memory 123) in which the process recipe is recorded. Then, when starting the substrate processing process, the CPU 121a of the substrate processing apparatus may appropriately select a proper process recipe from the plurality of process recipes stored in the memory 121c according to the contents of the substrate processing process. With this configuration, it is possible to form thin films of various film types, composition ratios, film qualities, and film thicknesses with a single substrate processing apparatus in a versatile and well-reproducible manner. In addition, it is possible to reduce an operator's operation burden (burden in inputting processing procedures, processing conditions, etc.) and to quickly start the substrate processing process while avoiding operation errors.

Further, the present disclosure can also be realized by, for example, changing the process recipes of an existing substrate processing apparatus. When changing the process recipes, the process recipes according to the present disclosure may be installed on an existing substrate processing apparatus via a telecommunications line or a recording medium on which the process recipes are recorded, or the input/output device of the existing substrate processing apparatus may be operated to change the process recipes of the existing substrate processing apparatus to the process recipes according to the present disclosure.

Further, the present disclosure can be used, for example, for a word line portion of a NAND flash memory or DRAM having a three-dimensional structure.

Although various typical embodiments of the present disclosure have been described above, the present disclosure is not limited to these embodiments and such embodiments may be used in proper combination.

Hereinafter, Examples will be described.

[Example 1]

In the present example, the substrate processing apparatus 10 shown in FIG. 1 was used, and a TiN film was formed on the substrate according to the substrate processing sequence shown in FIG. 4 and a substrate processing sequence of a comparative example.

In the substrate processing sequence of the comparative example, the third reducing gas was not supplied unlike the substrate processing sequence shown in FIG. 4. That is, a cycle in which the supply of the first-element-containing gas supply, the simultaneous supply of the first-element-containing gas and the first reducing gas, the supply of the first reducing gas, the supply of the inert gas, and the above-mentioned steps S14 to S19 are sequentially performed was executed a predetermined number of times to form a TiN film on a wafer.

Further, in the present example and the comparative example, as an example, a $TiCl_4$ gas was used as the first-element-containing gas, a $SiH_4$ gas was used as the first reducing gas, and an $NH_3$ gas was used as the second reducing gas. Further, in the present example, a $H_2$ gas was used as the third reducing gas as an example.

Figure 8A:
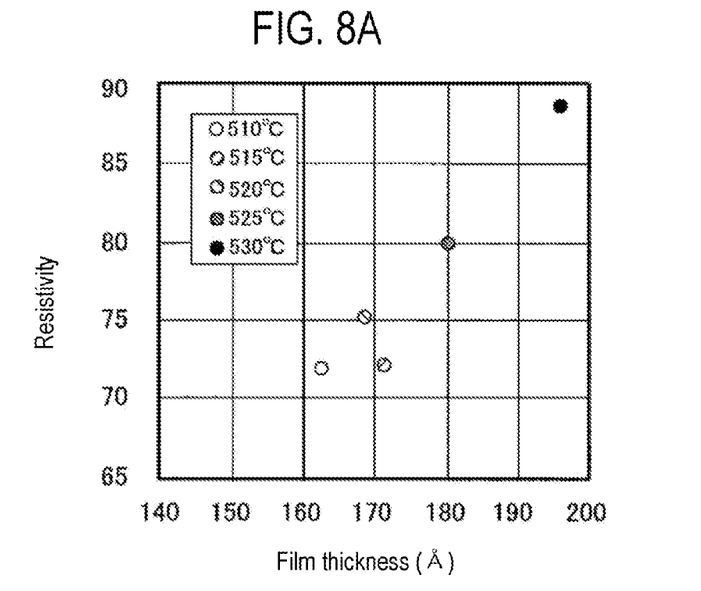
FIG. 8A is a diagram showing a relationship between a film thickness, a resistivity and a processing temperature of a film formed on a substrate using a substrate processing sequence according to a comparative example.
Figure 8B:
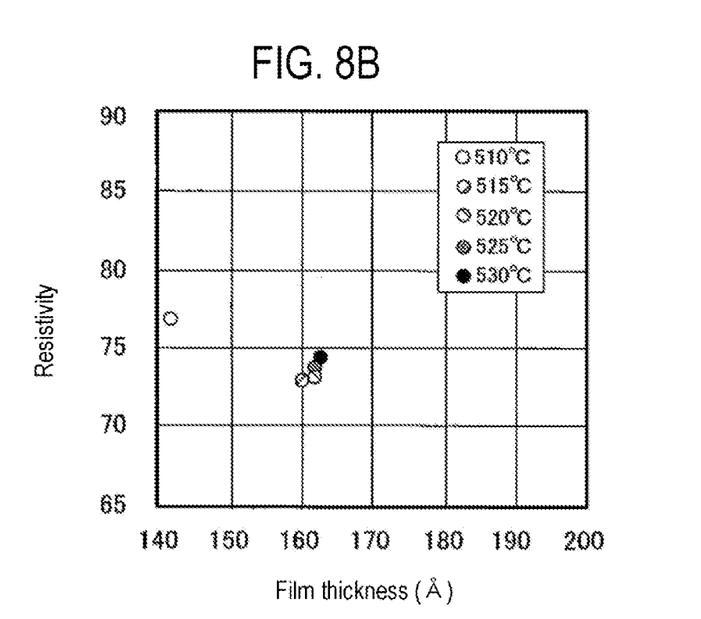
FIG. 8B is a diagram showing the relationship between the film thickness, the resistivity and the processing temperature of a film formed on a substrate using a substrate processing sequence according to the present example.

FIG. 8A is a diagram showing the relationship between the film thickness, the resistivity and the processing temperature of the TiN film formed using the substrate processing sequence of the comparative example, and FIG. 8B is a diagram showing the relationship between the film thickness, the resistivity and the processing temperature of the TiN film formed using the substrate processing sequence of the present example.

As shown in FIGS. 8A and 8B, when the substrate processing sequence of the comparative example is used, it was confirmed that if the processing temperature increases, the film thickness of the formed TiN film increases, and the resistivity thereof also increases. It is considered that as the processing temperature increases, the $SiH_4$ gas is thermally decomposed and the decomposition of Si and $2H_2$ is likely to occur, Si becomes introduced into the TiN film, and the resistivity is increased.

On the other hand, when the substrate processing sequence of the present example was used, no change was observed in the resistivity of the formed TiN film even if the processing temperature increases. That is, it was confirmed that, by supplying the $H_2$ gas and making the $H_2$ atmosphere in steps S11 to S13 of the substrate processing sequence shown in FIG. 4, even if the temperature in the process chamber becomes high, the thermal decomposition of the $SiH_4$ gas is suppressed, which makes it possible to prevent Si, which is a decomposition product, from being introduced into the TiN film.

According to the present disclosure in some embodiments, it is possible to improve the quality of a film formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions, and changes in the form of the embodiments described herein may be made without departing from the spirit of the disclosures. The accompanying claims and their equivalents are intended to cover such forms or modifications as would fall within the scope and spirit of the disclosures.

The invention claimed is:

1. A method of processing a substrate, comprising:
   (a) supplying a first-element-containing gas to the substrate in a process container;
   (b) supplying a first reducing gas to the substrate at least partially in parallel with (a), after a start of (a);
   (c) supplying a second reducing gas, which is different from the first reducing gas, to the substrate, after stopping (a);
   (d) supplying a third reducing gas, which is different from both the first reducing gas and the second reducing gas, to the substrate at least partially in parallel with (b) to suppress a decomposition of the first reducing gas; and
   (e) supplying an inert gas to the substrate in a pulse-wise manner,
   wherein a first-element-containing film is formed on the substrate by alternately performing (c) and a set of (a), (b) and (d) a predetermined number of times,
   wherein (d) is started after (a) is started, and stopped after stopping (a) and (b),
   wherein the first reducing gas includes at least two different elements,
   wherein (e) includes:
      (e1) supplying the inert gas to the substrate in a first time period in parallel with (d); and
      (e2) supplying the inert gas to the substrate in a second time period,
   wherein (e2) is started after a third time period elapses since (e1) is stopped, and
   wherein (c) is started after (e2) is stopped.

2. The method of claim 1, further comprising:
   (h) between (b) and (c), supplying an inert gas into the process container in parallel with (d).

3. The method of claim 2, further comprising:
   (i) after (h), exhausting an inside of the process container; and
   (j) after (i), supplying the inert gas into the process container.

4. The method of claim 1, further comprising:
   (h) between (b) and (c), supplying an inert gas into the process container in parallel with (d).

5. The method of claim 1, wherein (d) includes stopping (b), after stopping (a) during (b).

6. The method of claim 1, wherein the first reducing gas, the second reducing gas, and the third reducing gas are hydrogen-containing gases, respectively.

7. The method of claim 6, wherein the third reducing gas is a gas composed of a hydrogen element.

8. The method of claim 1, wherein the first reducing gas is a silane-based gas or a borane-based gas.

9. The method of claim 1, wherein the second reducing gas is a gas containing hydrogen and nitrogen.

10. The method of claim 1, further comprising:
    (k) during (a) and (b), stopping supply of an inert gas to the substrate.

11. The method of claim 1, wherein in (d), after stopping (b), the supplying the third reducing gas is continued for a predetermined period of time and then is stopped.

12. The method of claim 1, wherein in (e1), after stopping (b), the inert gas is supplied to the substrate.

13. The method of claim 1, wherein in (e2), after stopping (d), the inert gas is supplied to the substrate.

14. The method of claim 1, wherein in (d), after stopping (b), an inert gas is supplied to the substrate while a flow rate of the inert gas increases.

15. The method of claim 1, wherein in (e2), the third reducing gas is not supplied to the substrate.

16. The method of claim 1, wherein the inert gas is a purge gas.

* * * * *